(12) United States Patent
Tarui et al.

(10) Patent No.: US 6,885,048 B2
(45) Date of Patent: Apr. 26, 2005

(54) TRANSISTOR-TYPE FERROELECTRIC NONVOLATILE MEMORY ELEMENT

(75) Inventors: Yasuo Tarui, 9-27-304, Seda 1-chome, Setagaya-ku, Tokyo (JP); Kazuo Sakamaki, Tokyo (JP)

(73) Assignees: Yasuo Tarui, Tokyo (JP); Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/801,990

(22) Filed: Mar. 8, 2001

(65) Prior Publication Data

US 2004/0042290 A1 Mar. 4, 2004

(30) Foreign Application Priority Data

Mar. 16, 2000 (JP) ........................ 2000-073507

(51) Int. Cl.[7] ............................................. H01L 29/76
(52) U.S. Cl. ...................... 257/295; 257/295; 257/296; 257/300; 257/632; 438/254
(58) Field of Search .............................. 257/295, 296, 257/300, 632; 438/254

(56) References Cited

U.S. PATENT DOCUMENTS

| | | | | |
|---|---|---|---|---|
| 4,649,625 A | * | 3/1987 | Lu | 438/245 |
| 5,770,484 A | * | 6/1998 | Kleinhenz | 438/155 |
| 5,834,804 A | * | 11/1998 | Hwang et al. | 257/295 |
| 5,978,253 A | | 11/1999 | Lee et al. | |
| 5,990,515 A | | 11/1999 | Liu et al. | |
| 6,025,627 A | | 2/2000 | Forbes et al. | |
| 6,121,083 A | * | 9/2000 | Matsuki | 438/254 |
| 6,140,672 A | * | 10/2000 | Arita et al. | 257/295 |

FOREIGN PATENT DOCUMENTS

EP  0 940 856  9/1999

OTHER PUBLICATIONS

"Electrical Properties of MFIS–and MFMIS–FETs Using Ferroelectric $SrBi_2Ta_2O_9$ Film and $SrTa_2O_6$/SiON Buffer Layer" Extended Abstracts of the International Conference on Solid State Devices and Materials, Japan Society of Applied Physics, Tokyo, Japan; 1999, pp. 404–405, XP000935143; *p. 405; figure 1*.

* cited by examiner

*Primary Examiner*—David Nelms
*Assistant Examiner*—Mai-Huong Tran
(74) *Attorney, Agent, or Firm*—Jordan and Hamburg LLP

(57) ABSTRACT

A transistor-type ferroelectric nonvolatile memory element having an MFMIS (metal-ferroelectric-metal-insulator-semiconductor) structure that can be highly densely integrated. The MFMIS transistor has a constitution in which the MFM (metal-ferroelectric-metal) structure and the MIS (metal-insulator-semiconductor) structure are stacked up and down on nearly the same area, and the lower MIS structure has means for increasing the effective area of the MIS capacitance. Means for increasing the effective area of the capacitor is a trench in the semiconductor substrate, ruggedness in the MIS structure or a MIN (metal-insulator-metal) structure.

8 Claims, 9 Drawing Sheets

PRIOR ART

TRANSISTOR-TYPE FERROELECTRIC NONVOLATILE MEMORY ELEMENT

BACKGROUND OF THE INVENTION

1. Field of the Invention

This invention relates generally to a nonvolatile memory element and, more specifically, to a transistor-type ferroelectric nonvolatile memory element by using a ferroelectric material as a control gate.

2. Prior Art

A ferroelectric memory which has now been put into practice has a constitution in which the capacitor of DRAM is replaced by a ferroelectric capacitor (see, for example, Japanese Unexamined Patent Publication (Kokai) No. 113496/1990). The operation is based upon the detection of a difference in the amount of electric charge between when the polarization of capacitance of the ferroelectric material is inverted and when it is not inverted, thereby to judge whether the stored data is [1] or [0]. Therefore, this could become a so-called destructive readout in which the data held at the time of reading out the data is destroyed.

According to this method in which an electric charge by the inversion of polarization is taken out and detected as a current directly, further, the area of the capacitance becomes small and the current value becomes small so will not to be detected. This is a fundamental problem that occurs since the memory of this structure does not comply with the scaling side like the DRAM. Namely, there is a limitation on decreasing the area, electric current and electric power used therefor.

On the other hand, a field-effect transistor (FET) ferroelectric memory that uses a ferroelectric material as a control gate, works to turn a channel between source and drain on and off as the polarization of the ferroelectric material induces the electric charge of the channel of the transistor. In this case, the rate of change in the drain current remains the same despite the cell area is contracted proportionally. This means that the memory cell of the ferroelectric transistor complies with the scaling rule (Journal of the Japanese Academy of Electronic Information Communication, 77-9, 1994, pp. 976). In principle, therefore, there exists no limitation on decreasing he sizes.

Further, the transistor-type ferroelectric memory maintains the FET turned on or off relying upon the polarization of the ferroelectric material, and does not permit the data to be destroyed by the reading operation on a low voltage. Namely, the nondestructive readout can be accomplished.

The field-effect ferroelectric memory transistors using a ferroelectric material as a control gate can be roughly divided into two kinds. One kind is a ferroelectric transistor having an MFIS (metal-ferroelectric-insulator-semiconductor) structure in which the ferroelectric material undergoes the polarization to induce an electric charge on the surface of the semiconductor substrate via a gate-insulating film.

The other kind is a ferroelectric transistor having a gate of an MFMIS (metal-ferroelectric-metal-insulator-semiconductor) structure, and in which a metal (M) layer is sandwiched between a ferroelectric layer and an insulating layer of the MFIS structure. The present invention is concerned with the latter MFMIS.

The metal layer or the M layer referred to in this specification stands for a metal layer as well as a conductor layer such as of polycrystalline silicon.

FIG. 12 is a sectional view illustrating, in a simplified manner, the principle of a conventional MFMIS ferroelectric memory (T. Nakamura et al., Dig. Tech. Pap. of 1995 IEEE Int. Solid State Circuits Conf. p. 68, 1995). In FIG. 12, a source region 82 and a drain region 83 are formed in the main surface of a semiconductor substrate (S) 80, and a gate-insulating layer (I) 81 is laminated on the main surface of the semiconductor substrate therebetween. A first electrically conducting film (M) 84, a ferroelectric layer (F) 85 and a second electrically conducting film (M) 86 are stacked on the gate-insulating layer 81.

FIG. 13 shows an equivalent circuit of an MFMIS-structure portion of FIG. 12. In FIG. 13, it is necessary, from the standpoint of holding the memory, to apply a voltage until the polarization of the ferroelectric material F is saturated to a sufficient degree in polarizing the ferroelectric layer F by applying a voltage across the upper electrode A and the semiconductor substrate B. For this purpose, it is important to so design that a capacitance CF (capacitance of the ferroelectric layer) is smaller than a capacitance CI (capacitance of the gate-insulating layer). The capacitances CF and CI vary in proportion to the effective surface area of the gate-insulating layer I or the ferroelectric layer F to which a voltage is applied, and vary in reverse proportion to the thickness thereof.

It can therefore be contrived to decrease the thickness of the gate insulating layer I and to increase the thickness of the ferroelectric layer F, so that the capacitance CF (capacitance of the ferroelectric layer) becomes smaller than the capacitance CI (capacitance of the gate-insulating layer). Limitation, however, is imposed on decreasing the thickness of the gate-insulating layer I from the standpoint of breakdown voltage and leakage current. When the thickness of the ferroelectric layer F is increased, a high polarization voltage is necessary for saturating the polarization of the ferroelectric material.

The conventional method of selecting the capacitance CF to be smaller than the capacitance CI by avoiding these problems, is to vary the effective areas of the capacitances CF and CI. FIG. 14 is a diagram illustrating the principle in a simplified manner. It can be considered that FIG. 14 is a plan view of when the structure of FIG. 12 is seen from the upper side. An MFMIS structure 92 having a ferroelectric layer is formed in only a portion of the area of the MIS (metal-insulator-semiconductor) portion 91 that constitutes CI. Reference numeral 80 denotes a semiconductor substrate, 82 denotes a source region, and 83 denotes a drain region. The above conventional method makes it possible to design the capacitance CF to be smaller than the capacitance CI as required.

The above conventional method, however, involves a problem in that despite the MFMIS portion 92 is formed in a minimum machinable size, the MIS portion 91 becomes larger by an area ratio relative to the MFMIS portion 92 and, after all, occupies a large area making it difficult to accomplish a high degree of integration. Another problem of the conventional structure shown in FIG. 12 is that it is difficult to shorten the channel length between source and drain to a sufficient degree maintaining good reproduceability while adjusting the positions of source, drain and gate.

That is, as shown in FIG. 12, if the MFMI portion is formed in the same size and, then, the heat treatment is effected to introduce impurities for forming source and drain, impurities contained in the ferroelectric material are likely to be liberated and may diffuse into silicon to deteriorate the device characteristics. Further, when the end surface is machined at one time as shown in FIG. 12, the leakage current may increase on the side walls.

On the other hand, if the MIS structure is formed by using polycrystalline silicon on a silicon oxide film by employing a self-alignment method by using a silicon gate and if the MFM (metal-ferroelectric-metal) structure is constituted after the diffusion of silicon gate, then, the channel length can be decreased between source and drain. In this case, however, very little margin is allowed for positioning in constituting the MFM structure on the MIS structure.

That is, referring to FIG. 15, if an electrically conductor 84 of a ferroelectric material (F) 85 is connected via a contact hole 89 formed in an interlayer-insulating film 88 on the upper part of a silicon gate transistor having a polycrystalline silicon gate 87, then, the electrically conductor 84 comes into contact with the silicon substrate 80 as shown in FIG. 16 due to deviation in the positioning of the contact hole 89. Therefore, the gate width of the silicon gate 87 cannot be decreased to a sufficient degree by taking into consideration the positioning precision of the contact hole 89.

SUMMARY OF THE INVENTION

This invention, therefore, is to solve the above problem inherent in the prior art. It is an object of this invention to provide a transistor-type ferroelectric nonvolatile memory element which has a decreased memory cell area to realize a highly dense integration, which, at the same time, makes it possible to shorten the channel length maintaining good reproduceability, and enables the size to be decreased to a minimum machinable size in an LSI production process.

In order to accomplish the above object according to this invention, there is provided a transistor-type ferroelectric nonvolatile memory element having an MFMIS (metal-ferroelectric-metal-insulator-semiconductor) structure, comprising:

an MFM (metal-ferroelectric-metal) structure and an MIS (metal-insulator-semiconductor) structure stacked up and down; and means for increasing the effective area of a capacitance of the lower MIS structure as compared with the effective area of a capacitance of the upper MFM structure.

Means for increasing the effective area is a trench or a rugged portion formed in a semiconductor substrate, and the effective area of the capacitance of the MIS structure is increased by the trench or by the rugged portion. Further, means for increasing the effective area may be an MIM (metal-insulator-metal) structure interposed between the MFM structure and the MIS structure.

That is, the invention has a semiconductor substrate and a trench formed in the semiconductor substrate, wherein the MIS structure is formed in the trench, the MFM structure is laminated on the trench in parallel with the main surface of the semiconductor substrate, and means for increasing the effective area is constituted by the trench.

According to this invention, further, the MIS structure is a detector MIS transistor of the nonvolatile memory element, the regions of source, base and drain of the MIS transistor are formed in the semiconductor substrate in order of source, base and drain from the lower side, and means for increasing the effective area is a gate structure of the MIS transistor formed on the inner surface of the trench.

In this invention, further, the MIS structure is a detector MIS transistor of the nonvolatile memory element, the regions of source, base and drain of the MIS transistor are formed in the semiconductor substrate in order of drain, base and source from the lower side, and means for increasing the effective area is a gate structure of the MIS transistor formed on the inner surface of the trench.

In this invention, further, the MIS structure is a MIS transistor of the nonvolatile memory element, the regions of source and drain of the MIS transistor are isolated by the trench, and means for increasing the effective area is a gate structure of the MIS transistor formed on the inner surface of the trench.

In this invention, further, the MIS structure includes a rugged portion, and means for increasing the effective area of the MIS structure is constituted by the rugged portion. The upper portion of the MIS structure is flat, and an MFM structure is laminated thereon.

In this invention, further, means for increasing the effective area is constituted by an MIM (metal-insulator-metal) structure provided between the MFM structure and the MIS structure.

According to this invention, the effective area of the capacitance of the MIS portion can be increased compared to the effective area of the capacitance of the MFM portion which are stacked up and down on nearly the same area without increasing the area that is occupied. As a result, there is provided a transistor-type ferroelectric nonvolatile memory element which has a decreased memory cell area to realize a highly dense integration, which, at the same time, makes it possible to shorten the channel length maintaining good reproduceability, and enables the size to be decreased to a minimum machinable size in an LSI production process.

BRIEF DESCRIPTION OF THE DRAWINGS

FIG. 5b is a sectional view of the ferroelectric transistor having the MFMIS structure according to the fifth embodiment of this invention cut along the line b—b of FIG. 5a;

DESCRIPTION OF THE PREFERRED EMBODIMENTS

Figure 1:
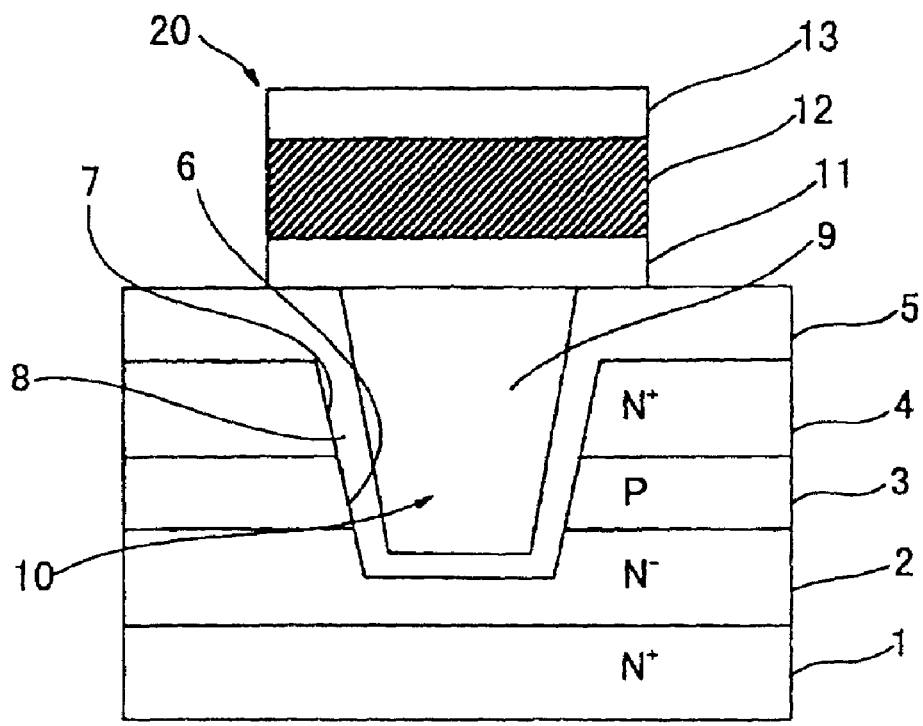
FIG. 1 is a sectional view of a ferroelectric transistor having an MFMIS structure according to a first embodiment of this invention.

A first embodiment of the present invention will be described with reference to FIG. 1. In this embodiment, an $N^-$-type layer 2 is epitaxially grown on an $N^+$-type silicon substrate (S) 1 that serves as a drain layer. In the $N^-$-type layer 2 are doubly diffused P-type impurities and N-type impurities to successively form a P-type layer 3 that serves as a base layer and an $N^+$-type layer 4 that serves as a source layer. An insulating layer 5 of silicon oxide is laminated on the $N^+$-type layer 4 by the thermal oxidation. A trench 6 is formed in the substrate 1 reaching the $N^-$-type layer 2 penetrating through the insulating layer 5, $N^+$-type layer 4 and P-type layer 3. The trench 6 has side walls 7 that are inclined to some extent such that the opening portion thereof is slightly larger than the bottom portion thereof. The inner surfaces of the trench 6, i.e., the side surfaces and the bottom are covered with a silicon oxide film that serves as a gate oxide layer (I) 8.

The trench 6 is filled with, for example, an electric conductor (M) 9 such as polycrystalline silicon or a metallic material. As a result, on the side walls 7 of the trench 6 is formed an MIS structure 10 of semiconductor (S) comprising the electric conductor (M) 9, gate oxide layer (I) 8, $N^+$-type substrate (drain) 1, $N^-$-type layer 2, P-type layer (base) 3 and $N^+$-type layer (source) 4. The gate oxide layer 8 covering the inner surface of the trench 6 increases the effective area of the capacitance of the MIS structure. The effective area can be varied by controlling the depth of the trench 6 and by changing the area of the inner surface thereof.

The upper part of the trench 6 filled with the electric conductor 9 is in flush with the insulating layer 5, i.e., is flattened to be in parallel with the main surface of the semiconductor substrate 1, and on which are laminated an electrically conducting (M) layer 11, a ferroelectric layer (F) 12 and an electrically conducting (M) layer 13 in this order. As a result, an MFM structure 20 is formed on the trench 6.

The MFM structure 20 on the trench 6 and the MIS structure 10 in the trench 6 occupy nearly the same area of the main surface of the silicon substrate 1 up and down. Here, however, the effective area of the capacitance of the MIS structure 10 can be controlled in a manner as described above and can, hence, be selected to be sufficiently larger than the effective area of the capacitance of the MFM structure 20.

Here, the MIS structure 10 of the embodiment of FIG. 1 has a feature of a transistor capable of forming a short channel length due to a difference in the double diffusion (First Solid Element Conference 4-1, Supplement to the Journal of the Japan Society of Applied Physics, Vol. 39, 1970, pp. 105–110).

In the constitution of the embodiment of FIG. 1, further, the silicon oxide layer 5 covering the silicon surfaces is formed sufficiently thickly prior to forming the trench 6. When the MFM structure 20 is formed on the trench 6 and on the silicon oxide layer 5 as shown in FIG. 1, therefore, the MFM structure 20 on the thick oxide layer 5 is favorably separated from the silicon substrate 1 permitting stray capacity to be formed little.

In the constitution of the embodiment of FIG. 1, further, the thickness of the $N^-$-type layer 2 and the depth of the trench 6 are controlled, to let the $N^-$-type portion 2 of the MIS structure 10 at the lower part of the trench 6 on the side of the silicon substrate 1 to enter into the depletion layer. This prevents an increase in the undesired capacity between the gate and the drain, and makes it possible to accomplish the operation of a very high speed.

Figure 2:
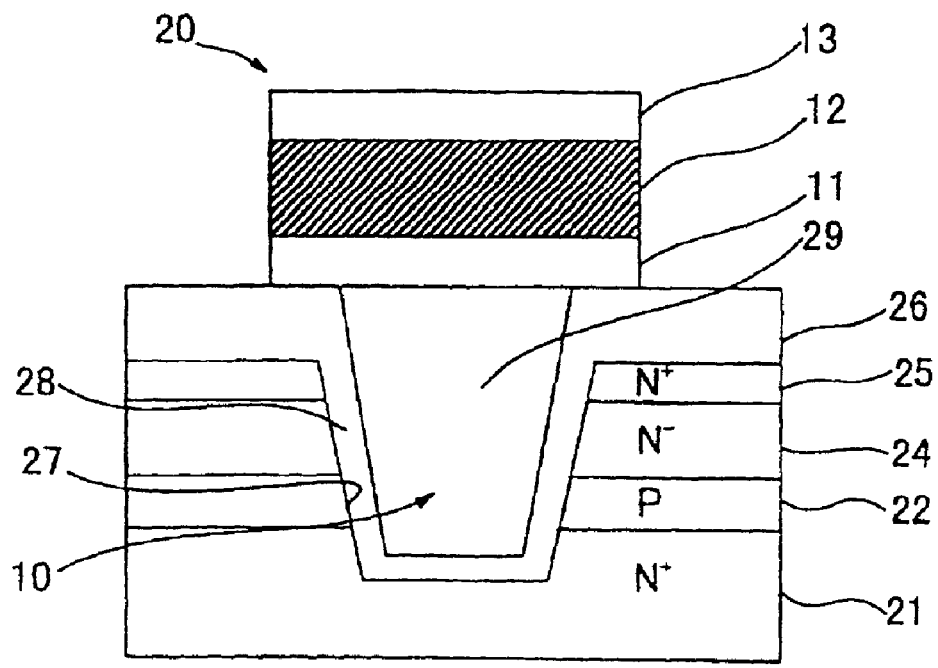
FIG. 2 is a sectional view of the ferroelectric transistor having the MFMIS structure according to a second embodiment of this invention.

FIG. 2 illustrates a second embodiment of the invention. In this embodiment, a P-type layer 22 that serves as a base is epitaxially grown on an $N^+$-type silicon substrate 21 that serves as a source. An $N^-$-type layer 24 and an $N^+$-type layer 25 are formed in the P-type layer 22 by double diffusion thereby to form a drain. An insulating layer 26 of silicon oxide is formed on the $N^+$-type layer 25. A trench 27 is formed from the main surface side of the silicon substrate 21 by removing portions of the insulating layer 26, $N^+$-type layer 25, $N^-$-type layer 24, P-type layer 22 and silicon substrate 21. An oxide is formed on the inner surfaces of the side walls and bottom portion of the trench 27 to thereby form a gate oxide layer 28. Like in the embodiment of FIG. 1, the interior of the trench 27 is filled with an electric conductor 29 such as polycrystalline silicon. Therefore, the MIS structure 10 is formed by the electric conductor (M) 29, gate oxide layer (I) 28, $N^+$-type layer 25, $N^-$-type layer 24, P-type layer 22 and a semiconductor (S) which is the $N^+$-type silicon substrate 21. An MFM structure 20 same as that of FIG. 1 is laminated on the flat trench 27. The structure of the second embodiment shown in FIG. 2 has a feature in that the drain portion can be easily isolated electrically and an electrode can be easily taken out from the silicon surface.

Figure 3:
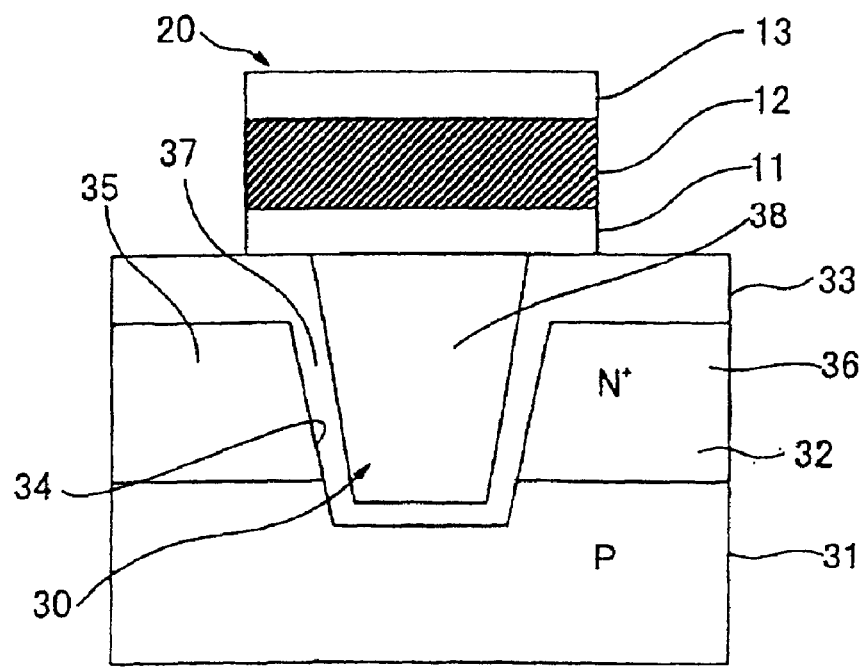
FIG. 3 is a sectional view of the ferroelectric transistor having the MFMIS structure according to a third embodiment of this invention.

FIG. 3 illustrates a third embodiment of the invention. This embodiment has a more simple MIS transistor structure 30. An $N^+$-type layer 32 is formed by diffusion on a P-type silicon substrate 31. An insulating layer 33 of silicon oxide is laminated on the $N^+$-type layer 32. A trench 34 is formed to reach the P-type silicon substrate 31 from the insulating layer 33 penetrating through the N'-type layer. The trench 34 divides the $N^+$-type layer 32 into right and left parts, which constitute a drain region 35 and a source region 36, respectively. A gate oxide film 37 is formed on the inside of the side walls and bottom surface of the trench 34. The trench 34 is filled with a conductor 38 such as polycrystalline silicon to thereby form a MIS structure 30. An MFM structure 20 is formed on the flat trench 34 like in FIG. 1.

In the structure of the third embodiment of FIG. 3, too, the effective area of the capacitance of the MIS structure 30 is determined by the gate oxide film 37 on the inner surface of the trench 34, and is larger than the effective area of the MFM structure 20 like in the above embodiments. In this embodiment, the drain region is above the surface on where the channel is formed, and the short-channel effect is exhibited little.

Figure 17:
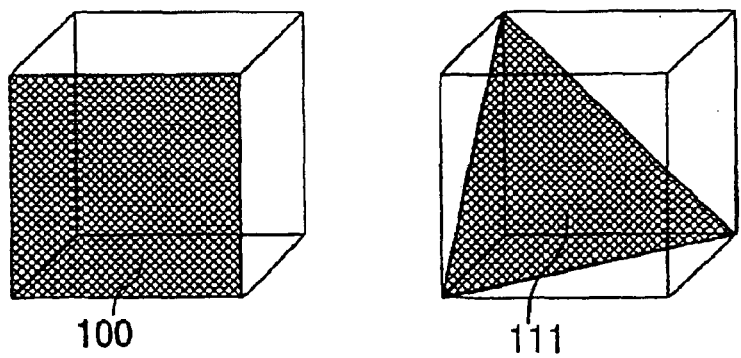
FIG. 17 is a diagram illustrating a relationship between a silicon crystal plane (100) and a silicon crystal plane (111)
Figure 18:
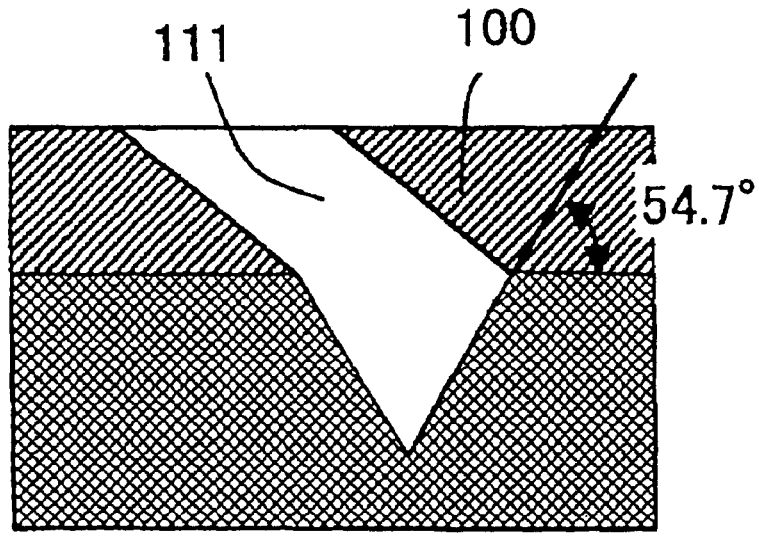
FIG. 18 is a sectional view illustrating a method of forming a V-groove from the silicon crystal plane (100) and the silicon crystal plane (111).

In the above embodiments, the side walls of the trench are not at right angles with the main surface of the silicon substrate but are mildly inclined so that the opening portion becomes wider than the lower part thereof. The trench is formed by utilizing a silicon crystal surface (100) in parallel with the main surface of the silicon substrate 1 and a silicon crystal surface (111) that is inclined relative thereto as shown in FIG. 17, and by selectively etching these crystal surfaces (by using, for example, a potassium hydroxide aqueous solution). FIG. 18 (which is a schematic diagram of when the main surface is viewed from an upper inclined direction) illustrates an example of forming a V-shaped trench in a silicon substrate relying on the anisotropic etching. As shown, an angle subtended by the silicon crystal surface (100) and by the silicon crystal surface (111) is 54.7 degrees. Here, since (1/cos 54.7°)=1.73, the multiplication factor of the areas of the side walls of the trench to the main surface can be set to be 1.73 times.

In an embodiment described below with reference to FIG. 6, the side walls of the trench are formed at right angles with the main surface of the silicon substrate. In this case, if the width of the trench is denoted by W, the length thereof by L and the depth thereof by D, then, the area of the main surface of the semiconductor substrate in the opening of the trench becomes WL. The effective area of the capacitance of the MFM structure on the trench is nearly equal to WL. On the other hand, the sum of the areas of the inner surfaces of the side walls and bottom portion of the trench becomes (2WD+2LD+WL). Therefore, the ratio to the area WL of the opening becomes (2D/W+2D/L+1). The effective area of the capacitance of the MIS structure in the trench is nearly equal to the area of the inner surface of the side walls and bottom surface of the trench. As a result, the effective area of the capacitance of the MIS structure in the trench becomes greater by about (2D/W+2D/L+1) times than the effective area of the capacitance of the MFM structure on the trench.

Figure 4:
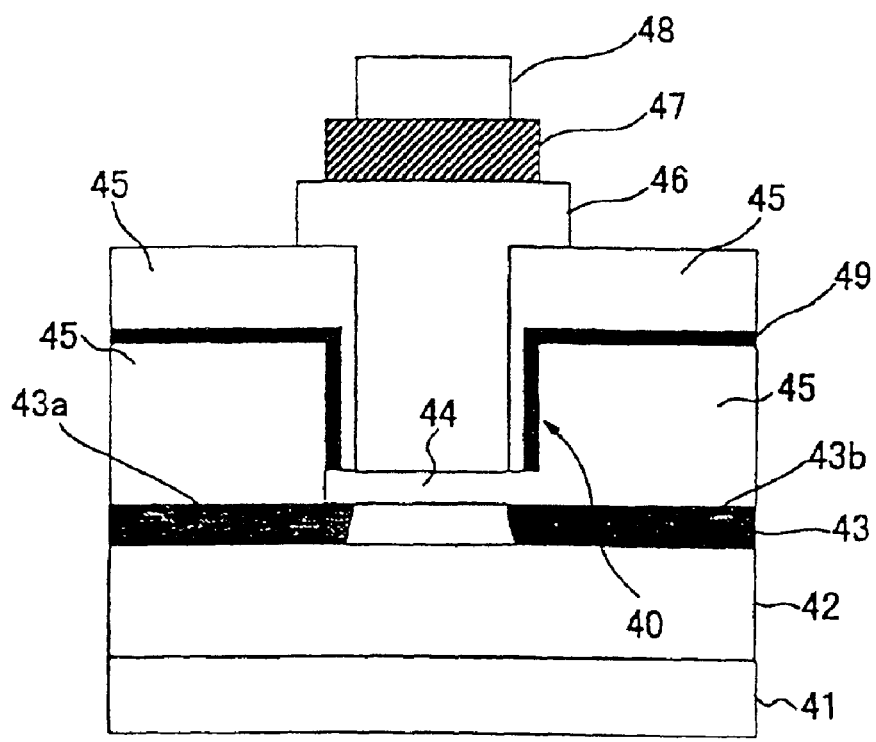
FIG. 4 is a sectional view of the ferroelectric transistor having the MFMIS structure according to a fourth embodiment of this invention.

Next, described below with reference to FIG. 4 is a fourth embodiment of this invention. This embodiment uses an SOI (silicon-on-insulator) substrate. If an MIS structure and an MFM structure are stacked on a thin SOI layer, then, it becomes difficult to form a deep silicon trench that was formed in the above embodiments. Therefore, an MIM (metal-insulator-metal) structure is formed between the MIS structure and the MFM structure to increase the effective area of the capacitance of the MIS structure. A region for forming a channel is constituted in the middle portion of the SOI layer 43, and a gate oxide film (I) 44 is laminated thereon.

That is, an insulating film 42 is laminated on a semiconductor substrate 41, and a semiconductor layer (S) 43 is laminated thereon. Both sides of the semiconductor layer 43 are forming a source region 43a and a drain region 43b, respectively. A region for forming a channel is constituted in the middle portion of the semiconductor layer 43, and a gate oxide film (I) 44 is laminated thereon. A more thick interlayer-insulating film 45 is laminated on the source region 43a and on the drain region 43b. A trench (groove) in which a first electric conductor (M) 46 will be introduced is formed in the interlayer-insulating film 45 on the gate oxide film 44. A MIS transistor structure is formed by a first conductor 46, the gate oxide film 44 and the semiconductor 43. A ferroelectric layer (F) 47 is laminated on the flat interlayer-insulating film 45 and on the first electric conductor 46, and a second electrically conducting layer (M) 48 is laminated thereon thereby to form the MFM structure. The second electrically conducting layer 48 has an area smaller than the area of the underlying ferroelectric layer 47. This is to decrease the effective area of the MFM structure and to relatively increase the effective area of the underlying MIS structure.

On the side walls of the trench (groove) in the interlayer-insulating film 45 in which the first electric conductor 46 is inserted, an electric conductor 49 for forming an MIM (metal-insulator-metal) structure 40 is opposed to the first electric conductor 46 via the interlayer-insulating film 45. The effective area of the MIM structure 40 can be varied by controlling the height of the interlayer-insulating film 45. The MIM structure 40 makes it possible to increase the effective capacitance of the MIS structure. The upper part of the interlayer-insulating film 45 is flat, and a flat MFM structure is laminated thereon. Therefore, the capacitance areas of the MFM structure and of the MIS structure enable the effective area of the MIS structure to be very larger than the effective area of the MFM structure despite equal areas are occupied on the main silicon surface.

Figure 5A:
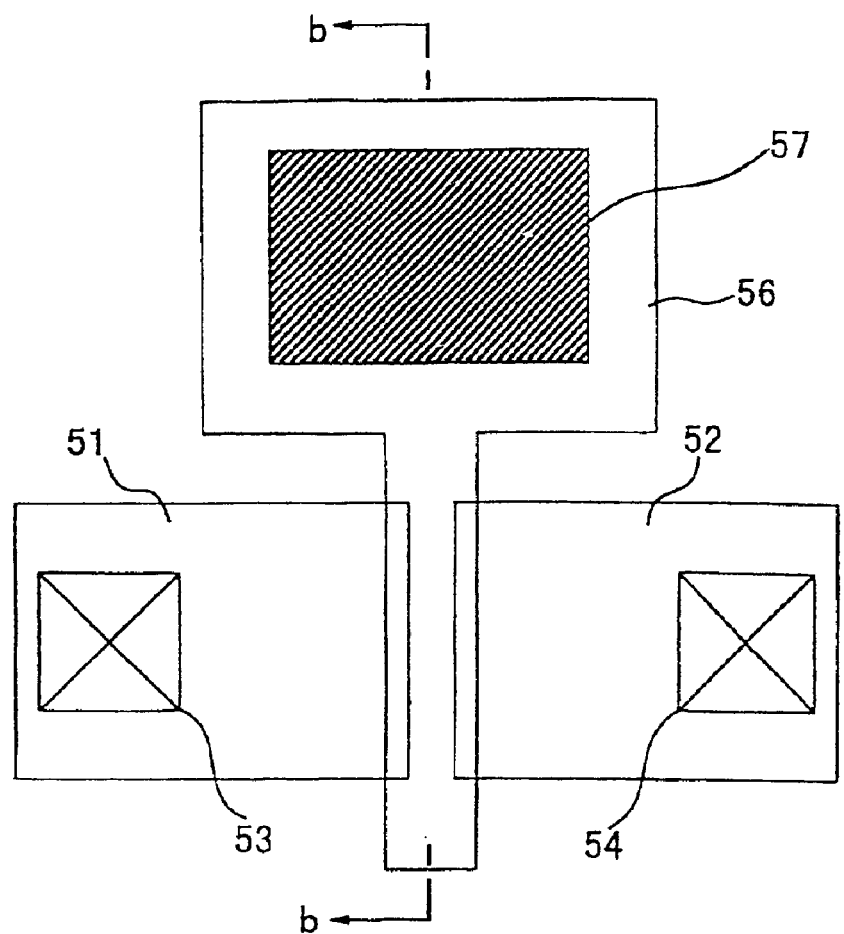
FIG. 5a is a plan view of when the ferroelectric transistor having the MFMIS structure according to a fifth embodiment of this invention is viewed from the upper side.
Figure 5B:
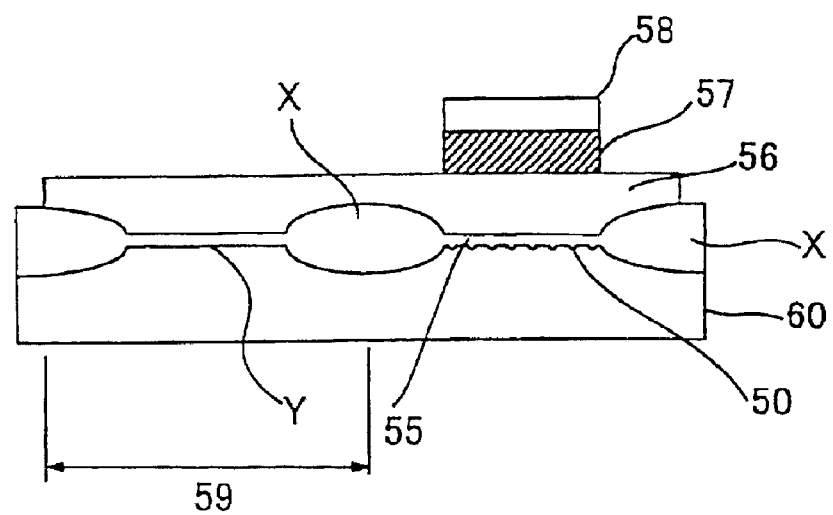

FIGS. 5a and 5b are diagrams illustrating a fifth embodiment of the invention. In this embodiment, unlike the above-mentioned embodiments, the silicon surface is chemically treated to form fine ruggedness in the order of microns in order to increase the effective area of the capacitance of the MIS structure. In a region 50 shown in FIG. 5b, fine ruggedness of the order of microns is formed on the surface of a silicon substrate 60 on where the transistor portion and the rugged portion have been isolated in advance by an insulating film, and an insulating film 55 is formed thereon to increase the surface area. On the rugged region 50 is laminated a first electrically conducting layer 56 that connects to a silicon gate on a gate-insulating film Y. Then, a resist is applied, and a structural portion on which the gate is laminated is worked at one time by photolithography and dry-etching. Then, impurities for source and drain are injected in a state where a protection film is formed so that source and drain impurities will not enter except the source and drain regions. Thus, a source region 51 and a drain region 52 are formed to thereby form a transistor portion 59. Then, a ferroelectric layer 57 is laminated on the upper surface of the first electrically conducting layer 56 of the upper part on where fine ruggedness of the order of microns is formed, and a second electrically conducting layer 58 is further laminated thereon. In the MIS structure having ruggedness, the insulating film 55 possesses an increased effective area owing to the ruggedness 50 formed on the surface that comes in contact with the first electrically conducting layer 56. This makes it possible to save the area on the wafer by an increment in the effective area. Reference numerals 53 and 54 denote contact areas to the source region 51 and the drain region 52.

In general, further, some ferroelectric materials impair the operation of the semiconductor when they diffuse into the semiconductor. In order to prevent the diffusion of the ferroelectric material, therefore, a barrier layer must often be inserted between the metal (M) portion coming in contact with the ferroelectric material or the ferroelectric material and the semiconductor.

Figure 6:
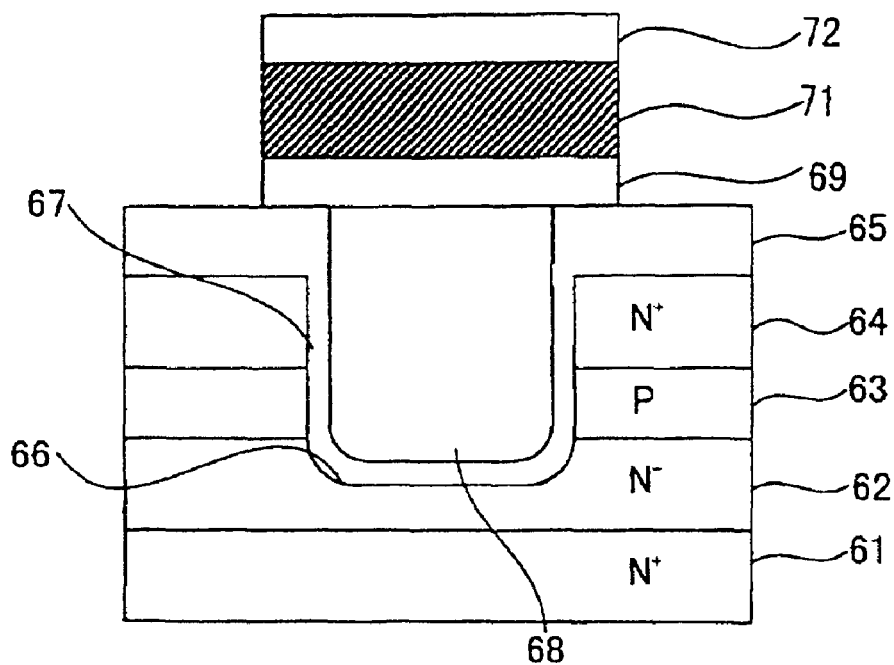
FIG. 6 is a sectional view of the ferroelectric transistor having the MFMIS structure according to a sixth embodiment of this invention.

FIG. 6 illustrates a sixth embodiment of this invention. In the sixth embodiment, an N⁻-type epitaxial layer 62 containing $3 \times 10^{17}$ cm$^{-3}$ of n-type impurities and having a thickness of 4.5 μm is formed on the main surface of an N⁺-type silicon semiconductor substrate 61. An N⁺-type source layer 64 having a thickness of 0.6 μm and a P-type base layer 63 having a thickness of 0.4 μm are formed from the surface of the N⁻-type layer 62 relying upon the double diffusion of boron and phosphorus. The oxide film formed during the double diffusion is further heat-treated to form an oxide film 65 maintaining a thickness of 0.5 μm.

Next, the oxide film 65 on the surface is removed from a portion (region having a width W and a length L of 1.0 μm, respectively) where a trench (groove) 66 is to be formed. Then, by using the oxide film 65 of the remaining portion as a mask, the trench 66 having a depth D of 4 μm is formed in the silicon semiconductor substrate by reactive ion etching so as to reach the N⁻-type layer. The side walls and bottom portion of the trench 66 exposed by etching are chemically cleaned to remove damaged layer and, then, a gate oxide film 67 is formed thereon maintaining a thickness of 10 nm by thermal oxidation.

Thereafter, polycrystalline silicon 68 is precipitated by CVD so as to be filled in the trench 66 up to the surface of the insulating film 65 of silicon oxide formed on the main surface of the silicon substrate 61 to become flat.

Next, a laminated film 69 of iridium dioxide and platinum is formed by sputtering as a first electrically conducting film on the polycrystalline silicon 68 filled in the trench 66 and is flattened. The laminated film 69 has a total thickness of about 200 nm.

Then, as a ferroelectric film 71, an $SrBi_2Ta_2O_9$ film is formed by a method of applying a metallic organic material followed by firing. This film has a thickness of about 200 nm.

Next, a second electrically conducting film 72 is formed by sputtering platinum. This film has a thickness of about 150 nm.

The second electrically conducting film 72, ferroelectric film 71 and first electrically conducting film 69 are worked in this order by photolithography and dry etching.

Figure 7:
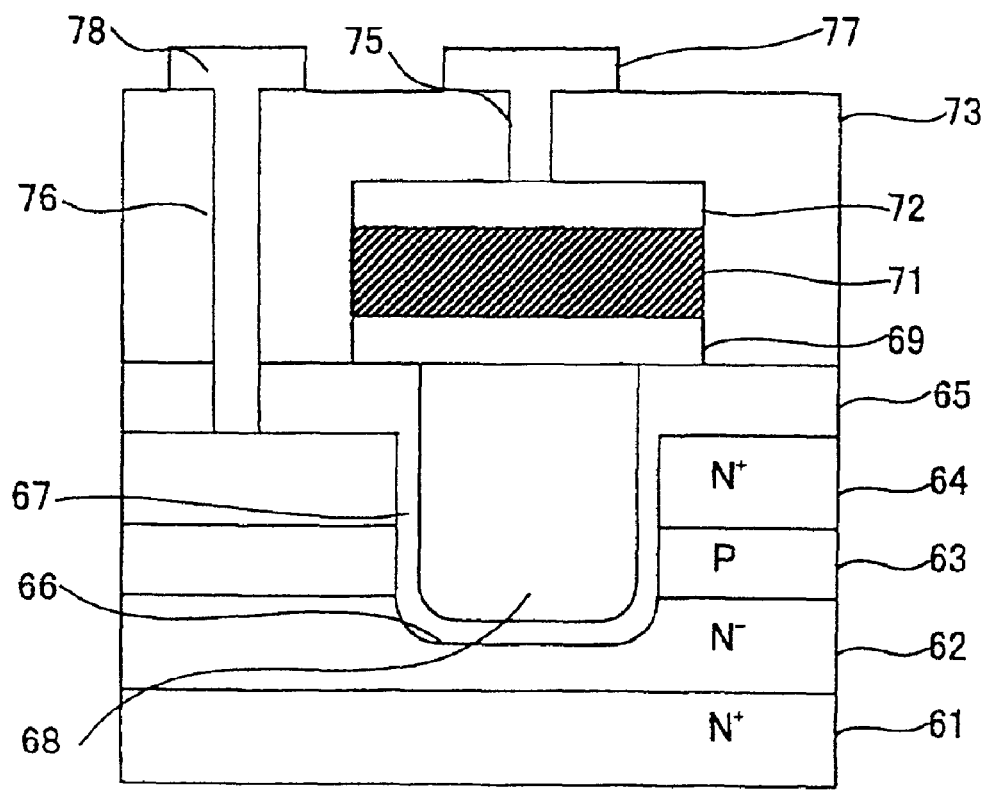
FIG. 7 is another sectional view of the ferroelectric transistor having the MFMIS structure according to the sixth embodiment of this invention.

Referring to FIG. 7, further, silicon oxide is formed as an interlayer-insulating layer 73 by plasma CVD. Then, contact holes 75 and 76 are formed to reach the second electrically conducting film 72, the source layer 64 and the drain layer (not shown) and, then, aluminum electrodes 77 and 78 are formed.

Figure 8:
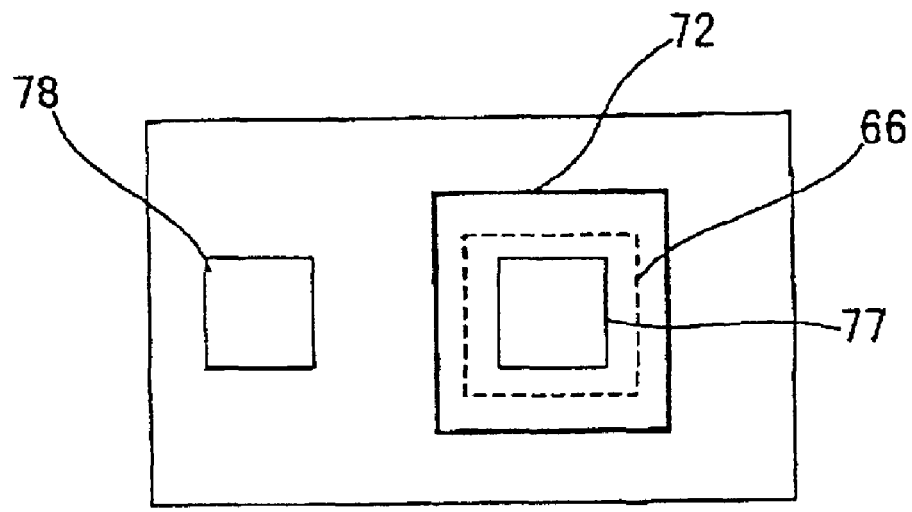
FIG. 8 is a plan view of when the ferroelectric transistor having the MFMIS structure according to the sixth embodiment of this invention is viewed from the upper side.

FIG. 8 is a plan view of when the thus completed ferroelectric transistor of this embodiment is viewed from the upper side. The size of the trench 66 is indicated by a dotted line, and the second electric conductor 72 thereon and the aluminum electrode 77 are shown. The source electrode 78 lies by the side thereof. In the case of FIG. 8, the connection to the drain is accomplished from the bottom surface of the chip, and the contact to the drain electrode is not shown here.

Figure 9:
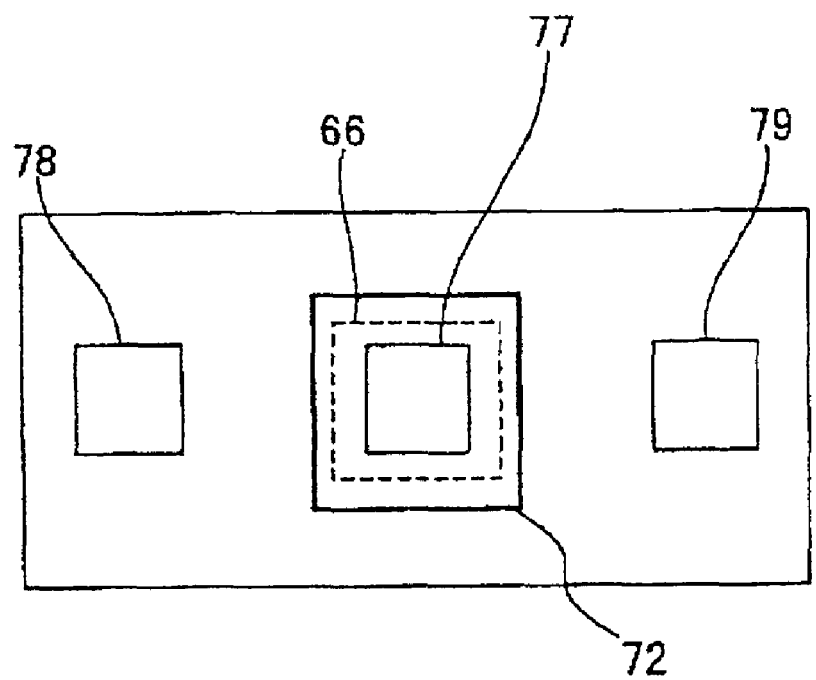
FIG. 9 is a plan view of when the ferroelectric transistor having the MFMIS structure according to the embodiment of this invention is viewed from the upper side.

In FIG. 9, a drain contact 79 to the drain electrode is provided on the upper surface. The drain contact 79 may be formed on the upper surface relying upon a method of leading the collector to the upper surface, that is employed in an integrated circuit of bipolar transistors. In other respects, the constitution is the same as that of FIG. 8. As will be understood from FIG. 9, the area occupied by the ferroelectric transistor in this embodiment is the occupied area on the wafer without waste determined by the precision of the lithography.

The effective area ratio of the capacitance CI of the MIS structure and the capacitance CF of the MFM structure formed by the embodiment of FIG. 6 is about 17.

Figure 10:
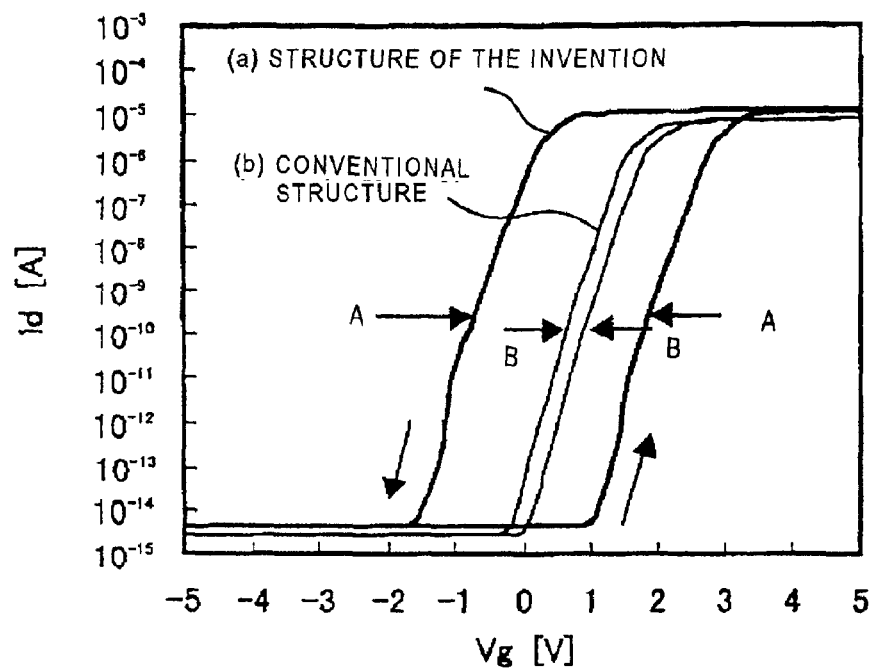
FIG. 10 is a graph illustrating drain current-gate voltage characteristics of the ferroelectric transistor having the MFMIS structure according to the invention and of the ferroelectric transistor having the MFMIS structure according to the prior art.
Figure 12:
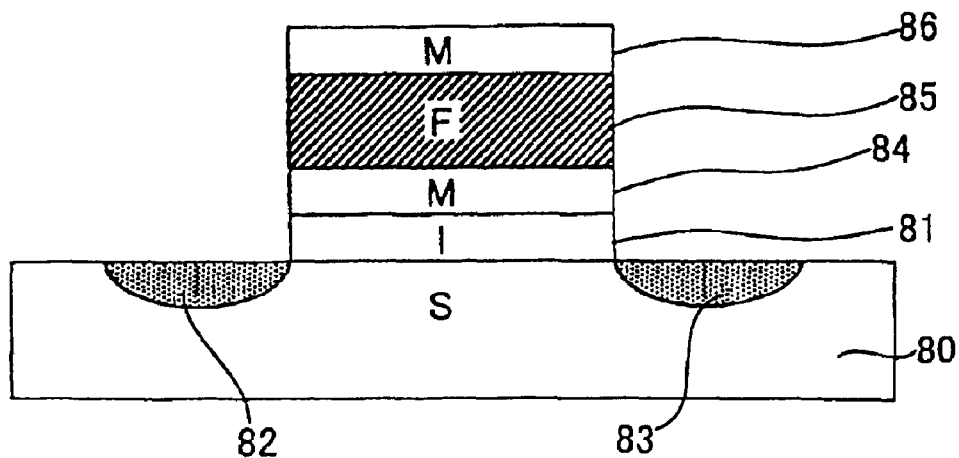
FIG. 12 is a sectional view of a ferroelectric transistor having the MFMIS structure according to the prior art.
Figure 13:
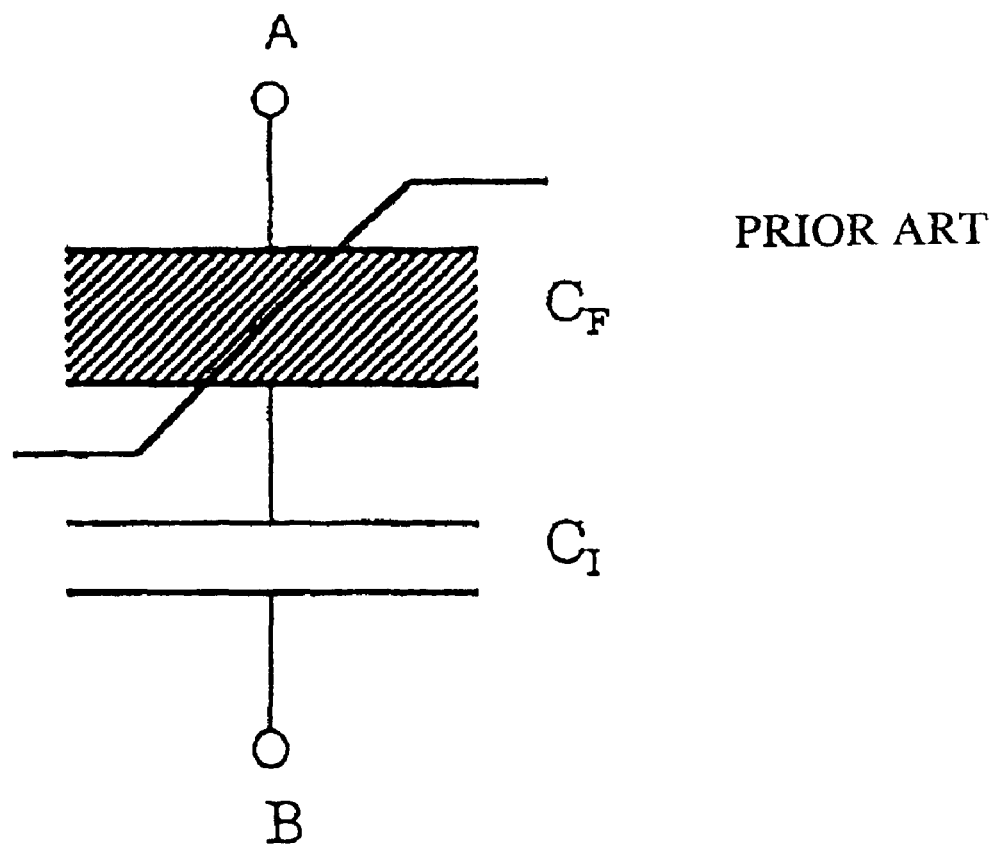
FIG. 13 is a diagram of an equivalent circuit of the ferroelectric transistor.
Figure 14:
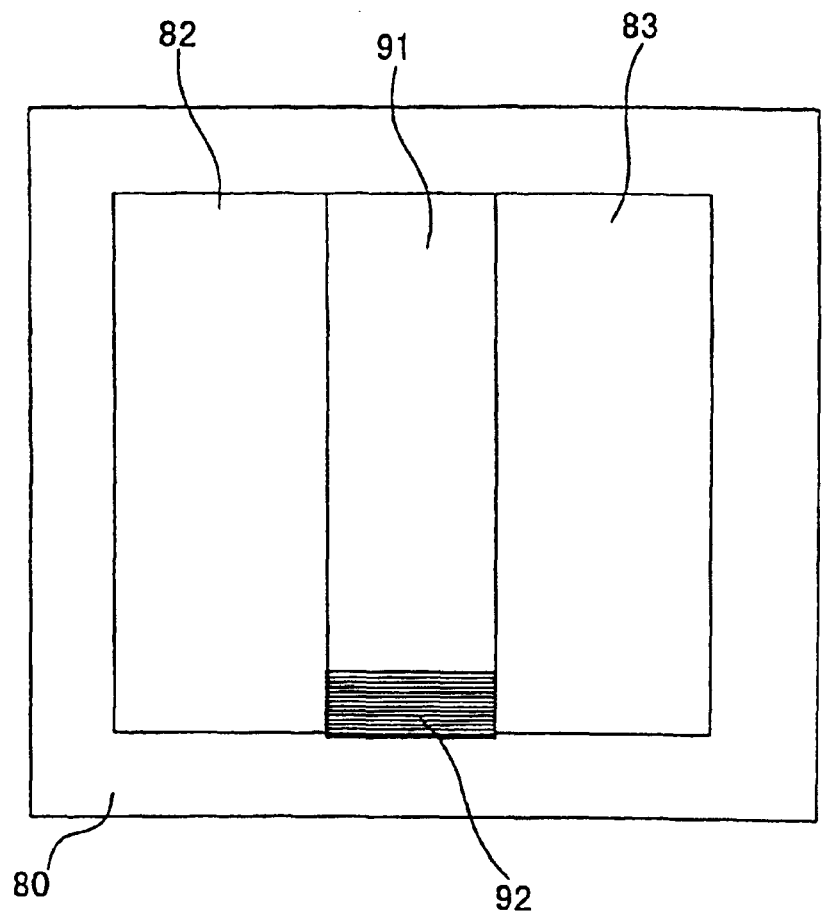
FIG. 14 is a plan view of when the ferroelectric transistor having the MFMIS structure according to the prior art is viewed from the upper side.
Figure 15:
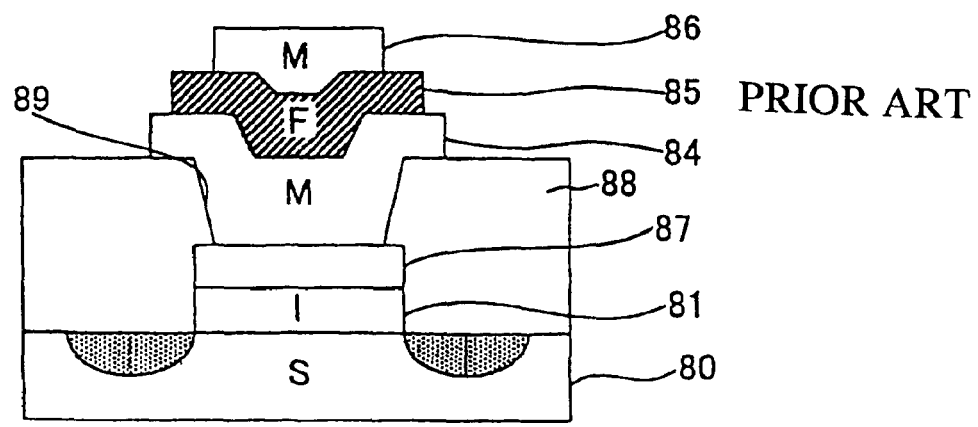
FIG. 15 is a sectional view of the ferroelectric transistor having the MFMIS structure according to the prior art.
Figure 16:
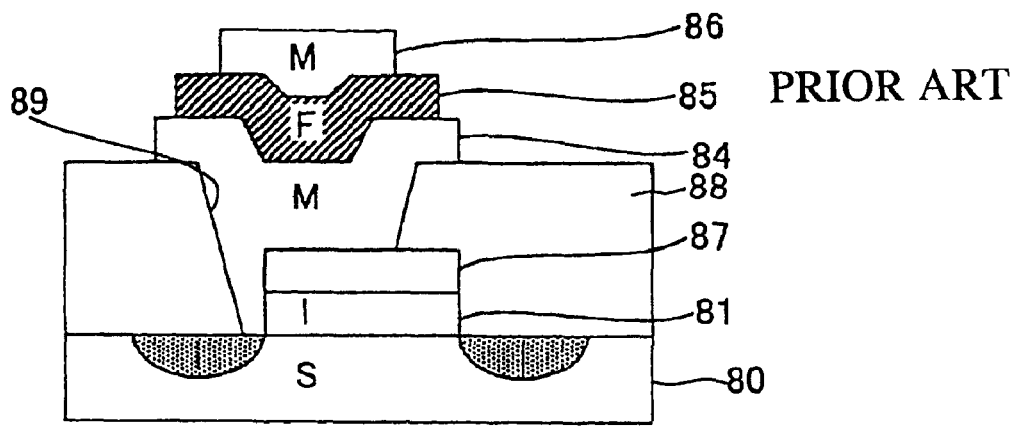
FIG. 16 is a sectional view of the ferroelectric transistor having the MFMIS structure according to the prior art.

In order to examine the effect of the MFMIS structure formed by the process of the embodiment of FIG. 6, a conventional MFMIS structure shown in FIG. 12 was so formed as to possess an effective area ratio of MFM and MIS of 1. FIG. 10 is a graph measuring the drain current-gate voltage (Id-Vg) characteristics of the MFMIS structure of the invention and of the conventional MFMFIS structure. In FIG. 10, a curve (a) represents the Id-Vg characteristics of the MFMIS structure of the embodiment shown in FIG. 6, and a curve (b) represents Id-Vg characteristics of the conventional MFMIS structure shown in FIG. 12.

The deviation (width of memory window) A of threshold due to the polarization of the ferroelectric material represented by the curve (a) is ten times as great as the deviation (width of memory window) B of threshold represented by the curve (b). Thus, it is allowed to realize a memory element which offers a large operation margin without increasing the area occupied by the MIS structure.

Figure 11:
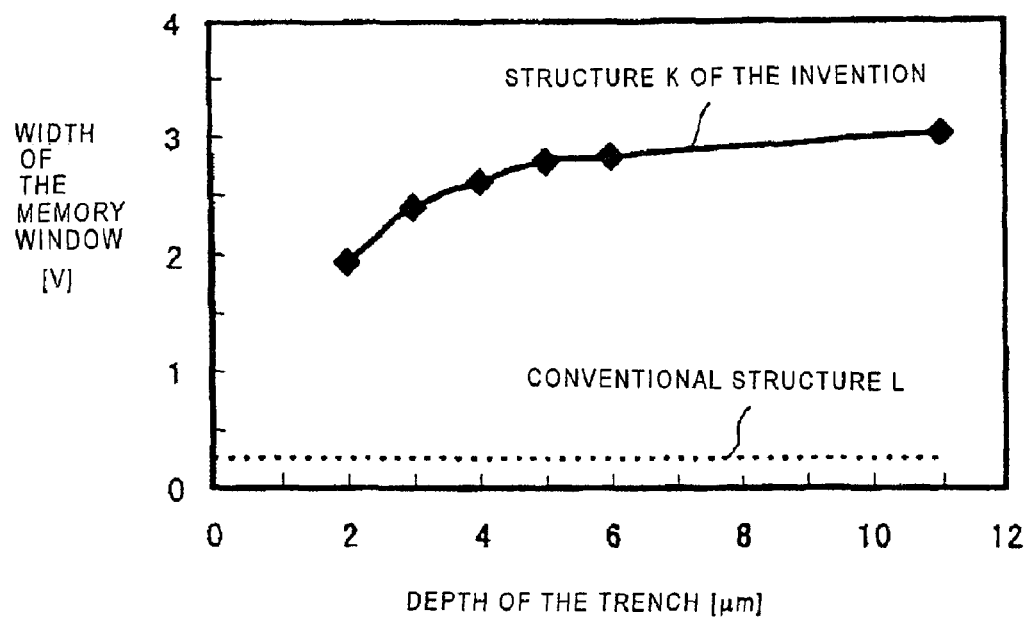
FIG. 11 is a graph illustrating a relationship between the width of the memory window and the depth of the trench of the MFMIS structure according to this invention.

FIG. 11 is a graph illustrating a change in the width of the memory window to the depth of the trench. In FIG. 11, the abscissa represents the depth of the trench. The depth of the trench is a total of 1 μm including 0.6 μm of the source and 0.4 μm of the base. As will be understood from the structure K of the invention shown in FIG. 11, the width of the memory window is nearly ten times as great as that of the conventional structure L. As for the dependence of the memory window upon the depth of the trench, an increase in the memory window nearly reaches a point of saturation when the depth of the trench becomes larger than 6 μm.

In the embodiments shown in FIGS. 1, 2, 3, 5b and 6, too, the areas of the second electrically conducting layers 13, 58 and 72 on the ferroelectric thin films 12, 57 and 71 can be formed to be smaller than the areas of the ferroelectric thin films 12, 57 and 71 in order to decrease the effective areas of the MFM structures and to relatively increase the effective areas of the lower MIS structures like in the embodiment shown in FIG. 4.

According to the constitution of the MFMIS transistor of this invention as described above, the MFM structure and the MIS structure are stacked up and down on nearly the same area, and the lower MIS structure has means for increasing the effective area of the MIS capacitance. Therefore, the MFMIS transistor of the invention makes it possible to decrease the memory cell area and, hence, to accomplish a highly dense integration. The area on the silicon wafer needed for a high degree of integration can be decreased to a fraction, offering a great advantage.

What is claimed is:

1. A transistor-type ferroelectric nonvolatile memory element having an MFMIS (metal-ferroelectric-metal-insulator-semiconductor) structure formed in a semiconductor substrate, comprising:

an MFM (metal-ferroelectric-metal) structure and an MIS (metal-insulator-semiconductor) structure vertically arranged with the MFM structure above a level of the MIS structure; and means for increasing an effective area of a capacitance of the MIS structure as compared with the effective area of a capacitance of the MFM structure, the means for increasing the effective area including a substrate layer of the MIS structure being formed as one of a trench and a rugged portion such as to increase a surface area of an interface of an insulator layer and the substrate layer of the MIS structure.

2. A transistor-type ferroelectric nonvolatile memory element according to claim 1, wherein the trench is formed in the semiconductor substrate, the MIS structure is formed in the trench, the MFM structure is laminated on the trench nearly in parallel with a main surface of the semiconductor substrate, and means for increasing the effective area is the trench.

3. A transistor-type ferroelectric nonvolatile memory element according to claim 2, wherein the MIS structure is an MIS transistor of the nonvolatile memory element, regions of source, base and drain of the MIS transistor are formed in the semiconductor substrate in order of source, base and drain from a lower side of the semiconductor substrate, and the means for increasing the effective area is a gate structure of the MIS transistor formed in the semiconductor substrate on an inner surface of the trench.

4. A transistor-type ferroelectric nonvolatile memory element according to claim 2, wherein the MIS structure is an MIS transistor of the nonvolatile memory element, regions of source, base and drain of the MIS transistor are formed in the semiconductor substrate in order of drain, base and source from a lower side of the semiconductor substrate, and the means for increasing the effective area is a gate structure of the MIS transistor formed in the semiconductor substrate on an inner surface of the trench.

5. A transistor-type ferroelectric nonvolatile memory element according to claim 2, wherein the MIS structure is a MIS transistor of the nonvolatile memory element, and regions of source and drain of the MIS transistor are separated by the trench.

6. A transistor-type ferroelectric nonvolatile memory element according to claim 1, wherein the MIS structure includes the rugged portion therein, the means for increasing the effective area is constituted by the rugged portion, the upper part of the MIS structure is flat, and the MFM structure is laminated thereon.

7. A transistor-type ferroelectric nonvolatile memory element according to claim 1, wherein the means for increasing the effective area is constituted by an MIM (metal-insulator-metal) structure provided between the MFM structure and the MIS structure.

8. A transistor-type ferroelectric nonvolatile memory element according to claim 1, wherein the effective area of a metal layer on the ferroelectric layer of the MFM structure is smaller than that of the ferroelectric layer.

* * * * *